United States Patent
Hur et al.

(10) Patent No.: US 9,231,527 B2
(45) Date of Patent: Jan. 5, 2016

(54) CIRCUITS AND METHODS FOR POWER AMPLIFICATION WITH EXTENDED HIGH EFFICIENCY

(71) Applicant: QUALCOMM Incorporated, San Diego, CA (US)

(72) Inventors: Joonhoi Hur, San Diego, CA (US); Paul Joseph Draxler, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 8 days.

(21) Appl. No.: 14/088,321

(22) Filed: Nov. 22, 2013

(65) Prior Publication Data

US 2015/0145600 A1    May 28, 2015

(51) Int. Cl.
*H03F 1/02* (2006.01)
*H03F 1/32* (2006.01)
(Continued)

(52) U.S. Cl.
CPC .............. *H03F 1/0222* (2013.01); *H03F 1/025* (2013.01); *H03F 1/0233* (2013.01); *H03F 1/0255* (2013.01); *H03F 1/0288* (2013.01); *H03F 1/3241* (2013.01); *H03F 3/193* (2013.01); *H03F 3/211* (2013.01); *H03F 3/245* (2013.01); *H03F 3/45475* (2013.01); *H03F 2200/24* (2013.01); *H03F 2200/504* (2013.01); *H03F 2200/507* (2013.01); *H03F 2200/511* (2013.01); *H03F 2200/516* (2013.01); *H03F 2200/78* (2013.01); *H03F 2203/21193* (2013.01); *H03F 2203/45528* (2013.01)

(58) Field of Classification Search
CPC ............ H03F 1/0288; H03F 1/07; H03F 1/30

USPC ......................... 330/295, 124 R, 84, 126, 297
See application file for complete search history.

(56) References Cited

U.S. PATENT DOCUMENTS 6,492,867 B2   12/2002   Bar-David
7,336,127 B2   2/2008    Kennan
(Continued)

FOREIGN PATENT DOCUMENTS

EP    2372905 A1    10/2011
EP    2383884 A1    11/2011
JP    2009094803 A   4/2009

OTHER PUBLICATIONS

Colantonio P., et al., "The Doherty Power Amplifier"; Advanced Microwave Circuits and Systems; Apr. 2010; pp. 108-132; InTech; Rijeka, Croatia.

(Continued)

*Primary Examiner* — Henry Choe
(74) *Attorney, Agent, or Firm* — Fountainhead Law Group P.C.

(57) ABSTRACT

The present disclosure includes circuits and methods for power amplifiers. In one embodiment, a main and peaking amplifier receive dynamic power supply voltages to operate an RF power amplifier in a high efficiency range for a particular output voltage. The power supply voltages may be changed based on an output voltage so that the power amplifier operates within a high efficiency plateau. In one embodiment, different discrete power supply voltage levels are used for different output voltage ranges. In another embodiment, a continuous time varying power supply voltage is provided as the power supply voltage. A dynamic supply voltage may be generated having a lower frequency than a signal path of the power amplifier.

24 Claims, 14 Drawing Sheets

(51) Int. Cl.
*H03F 3/193* (2006.01)
*H03F 3/24* (2006.01)
*H03F 3/45* (2006.01)
*H03F 3/21* (2006.01)

(56) References Cited

U.S. PATENT DOCUMENTS

| | | | |
|---|---|---|---|
| 7,843,262 B2 * | 11/2010 | Takenaka | 330/136 |
| 7,876,159 B2 | 1/2011 | Wang et al. | |
| 7,893,770 B2 * | 2/2011 | Yamauchi et al. | 330/295 |
| 8,447,245 B2 * | 5/2013 | Staudinger et al. | 455/102 |
| 8,471,638 B2 | 6/2013 | Deguchi | |
| 2010/0079210 A1 * | 4/2010 | Yamauchi et al. | 330/295 |
| 2011/0199156 A1 * | 8/2011 | Hayakawa | 330/124 R |
| 2012/0299659 A1 | 11/2012 | Sankalp et al. | |
| 2013/0127542 A1 | 5/2013 | Schmidt | |

OTHER PUBLICATIONS

Kang D., et al., "Design of Bandwidth-Enhanced Doherty Power Amplifiers for Handset Applications"; IEEE Transactions on Microwave Theory and Techniques; Dec. 2011; pp. 3474-3483; vol. 59, No. 12.

Kim B., et al., "Envelope Tracking Technique for Mobile Handset Application (Inviter Paper)"; IEEE International Symposium on Radio-Frequency Integration Technology (RFIT); Nov. 21, 2012; pp. 234-236; Singapore.

Kimball D., et al., "Efficient and Wideband Envelope Amplifiers for Envelope Tracking and Polar Transmitters"; 2013 IEEE Topical Conference on Power Amplifiers for Wireless and Radio Applications (PAWR); Jan. 20, 2013; pp. 13-15; Santa Clara, CA.

McKnight K, "Doherty Power Amplifier Design"; Microwave Monolithic Integrated Circuit (MMIC) Course; Sep. 2009; John Hopkins University.

Nemati H M., et al., "Design of Varactor-Based Tunable Matching Networks for Dynamic Load Modulation of High Power Amplifiers"; IEEE Transactions on Microwav Theory and Techniques; May 2009; pp. 1110-1118; vol. 57, No. 5.

Walling J.S., et al., "A Class-G Supply Modulator and Class-E PA in 130 nm CMOS", IEEE Journal of Solid-State Circuits, Sep. 2009; pp. 2339-2347; vol. 44, No. 9.

International Search Report and Written Opinion—PCT/US2014/066695—ISA/EPO—Feb. 18, 2015.

Hur J., et al., "Highly efficient uneven multi-level LINC transmitter," Electronics Letters, Jul. 30, 2009, vol. 45, No. 16, pp. 837-838.

* cited by examiner

CIRCUITS AND METHODS FOR POWER AMPLIFICATION WITH EXTENDED HIGH EFFICIENCY

BACKGROUND

The present disclosure relates to electronic systems and methods, and in particular, to power amplifier circuits and methods.

Wireless systems typically include a transmitter and receiver coupled to an antenna to send and receive RF signals. Generally, a baseband system generates a digital signal that includes encoded information (data), and the digital signal is converted to an analog signal for transmission. The analog signal is processed and typically modulated (up converted) to an RF carrier frequency. After up conversion, the RF signal is coupled to an antenna through a power amplifier. The power amplifier increases the signal power so that the RF signal can communicate with a remote system, such as a base station, for example.

Wireless systems require power amplifiers that can transmit RF signals with a considerable range of instantaneous and average signal power levels. Generally, power amplifiers are sized and designed such that the optimal efficiency is only at the maximum instantaneous output power, resulting in a significant reduction in efficiency for dynamic signals. As such, advanced architectures that provide higher efficiency at output power levels other than the maximum instantaneous output power are sought.

SUMMARY

The present disclosure includes circuits and methods for power amplifiers. In one embodiment, a main and peaking amplifier receive dynamic power supply voltages to operate an RF power amplifier in a high efficiency range for a particular output voltage. The power supply voltages may be changed based on an output voltage so that the power amplifier operates within a high efficiency plateau. In one embodiment, different discrete power supply voltage levels are used for different output voltage ranges. In another embodiment, a continuous time varying power supply voltage is provided as the power supply voltage. A dynamic supply voltage may be generated having a lower frequency than a signal path of the power amplifier.

The following detailed description and accompanying drawings provide a better understanding of the nature and advantages of the present disclosure.

DETAILED DESCRIPTION

The present disclosure pertains to power amplifiers. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
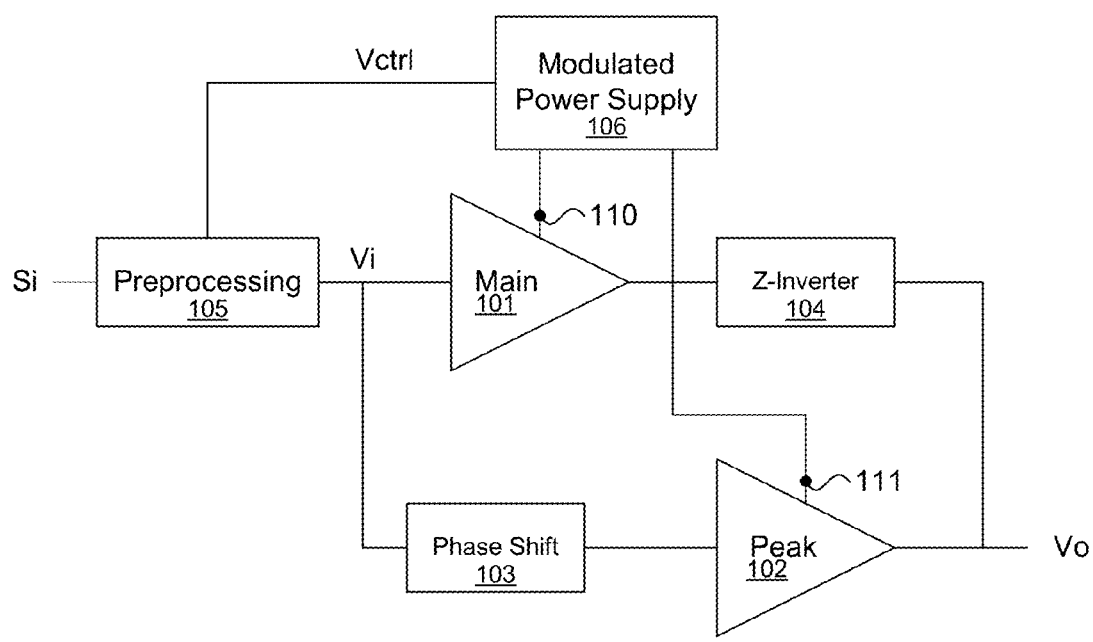
FIG. 1 illustrates a power amplifier according to one embodiment.

FIG. 1 illustrates a power amplifier according to one embodiment. Embodiments of the present disclosure include a power amplifier comprising a main (or carrier) amplifier stage 101 and a peaking (or auxiliary) amplifier stage 102. An output of the peaking amplifier stage 102 is coupled to an output of the main amplifier stage 101 through an impedance inverter circuit 104, which may be implemented as a quarter-wave transmission line, for example. The output of the peaking amplifier stage 102 is coupled to an output terminal of the power amplifier. An RF input signal, Vi, is received at an input of the main amplifier stage 101 through a phase shift circuit 103, for example. The power amplifier may be a radio frequency (RF) power amplifier configured to drive an antenna. An RF input signal Vi is also coupled to the input of peaking amplifier stage 102 through a quarter wave phase shift circuit 103. The power amplifier produces an output voltage, Vo, on the output terminal, which may be coupled to an antenna (not shown).

Example embodiments according to FIG. 1 may include a Doherty amplifier. Doherty amplifiers demonstrate high efficiency over a wide output power range. In some embodiments, the main amplifier stage may be class A, AB, or B, and the peaking amplifier stage may be class C, F, or another switch mode power amplifier, for example. The peaking amplifier stage may be off for small signal amplitudes and may turn on for larger signal amplitudes. For example, the main amplifier may be biased class A or class AB and the peaking amplifier may be biased at class C so that the peaking amplifier turns on when the input power is above a threshold (e.g., just before the main amplifier starts to go into compression).

Main amplifier stage 101 and peaking amplifier stage 102 each include power supply terminals 110 and 111 that are coupled to a power supply circuit 106. The power supply voltages provided to the power supply terminals of the main and peaking amplifiers may change as described herein to improve the efficiency of the power amplifier. Accordingly, such varying power supply voltages are referred to as dynamic power supply voltages, and as described in more detail below may change between different discrete voltage levels or vary continuously. Power supply 106 may change the power supply voltage to either or both of the main and peaking amplifiers based on one or more control signals, Vctrl, for example. As illustrated in the examples below, an input signal Si may be received in a preprocessing block 105, such as a predistortion block, and the control signal may change the power supply voltage(s) provided to either or both of the main and peaking amplifiers based on the characteristics of the signal to be transmitted (e.g., Vo) to improve the efficiency of the amplifier.

Figure 2:
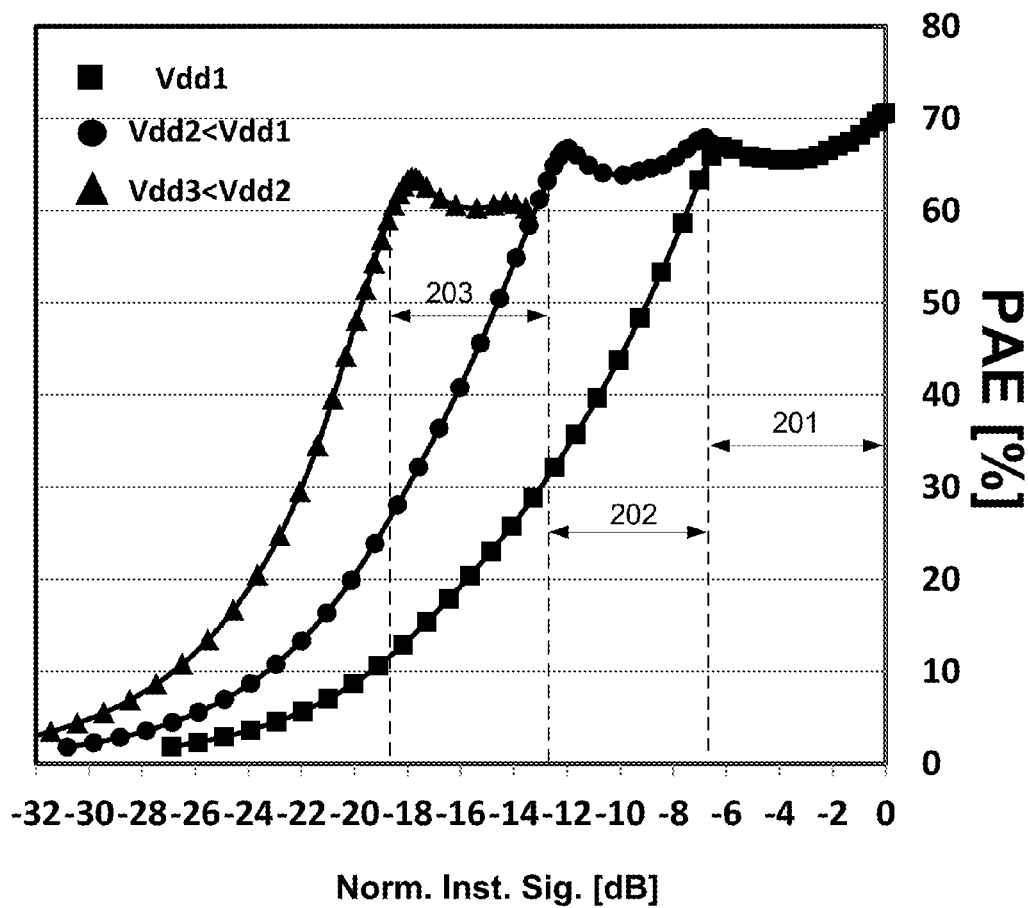
FIG. 2 illustrates power added efficiency at different power supply voltages according to one embodiment.

FIG. 2 illustrates power added efficiency (PAE) at different power supply voltages according to one embodiment. Features and advantages of the present disclosure may include changing the power supply voltage of the main and/or peaking amplifiers for particular output voltage levels to improve the efficiency of the power amplifier. FIG. 2 illustrates PAE versus instantaneous output signal power for a Doherty amplifier at three (3) different power supply voltages. Zero decibels (0 dB) is a maximum output signal power. As the normalized instantaneous output signal power ("Norm. Inst. Sig.") is reduced at a particular supply voltage, the efficiency (e.g., PAE) of the amplifier changes. As illustrated in FIG. 2, amplifier efficiency may change as a function of the supply voltage. For example, at a first power supply voltage, Vdd1, there is a first PAE peak at a maximum output voltage and a second PAE peak at a second output voltage below the maximum (e.g., in this example, about −6 dB below the maximum). The region 201 between the efficiency peaks forms a plateau, where the efficiency of the power amplifier is very high for output voltages across this range. In this example, PAE is approximately flat from a first PAE peak at a maximum output power down to a second PAE peak at about −6 dB from the maximum output power. Below the maximum output power by more than −6 dB, the efficiency decreases as the output power decreases.

Features and advantages of the present disclosure include changing the supply voltage to shift the high efficiency plateau for different output signal levels. As illustrated in FIG. 2, the power supply voltage may be changed (e.g., from Vdd1 to Vdd2, where Vdd2<Vdd1) to shift the peaks and the plateau to a new range 202. Range 202 may provide high efficiency operation for output signals between about −6 dB and about −12 dB. Similarly, this example shows another range 203 for another power supply voltage Vdd3 (Vdd3<Vdd2) to provide high efficiency operation for output signals below about −12 dB to about −18 dB, for example.

Accordingly, the graph in FIG. 2 illustrates that a power amplifier may achieve high efficiencies for a range of output voltages at different power supply voltages. For example, a power amplifier may produce output voltages corresponding to 0 dB to about −6 dB with high efficiency if the power supply voltage is set to Vdd1. Similarly, a power amplifier may produce output voltages corresponding to about −6 dB to about −12 dB with high efficiency if the power supply voltage is set to Vdd2. Likewise, a power amplifier may produce output voltages corresponding to −12 dB to about −18 dB with high efficiency if the power supply voltage is set to Vdd3, for example.

Therefore, for a particular power amplifier output voltage, there is a range (or window) of power supply voltages that may be used that result in high efficiency operation. In one embodiment, power amplifier efficiency may be improved by adjusting the power supply voltage so that a difference between the power supply voltages and the power amplifier output voltage is maintained within a predetermined range of high efficiency operation. In one embodiment described in more detail below, discrete power supply voltages are used for establishing a plurality of ranges where high efficiency operation is achieved. In another embodiment, the power supply voltages may be adjusted continuously, creating a moving window that tracks the output voltage. Because there are a range of power supply voltages that result in high efficiency operation for a particular output voltage, the changes in the power supply voltage may be configured to move much slower than the output voltage, for example, so that the power supply circuit producing the power supply voltage may have a lower bandwidth than the circuits in the signal path, such as the power amplifier. Embodiments of the present disclosure may vary the power supply voltages based on the signal envelope.

Figure 3:
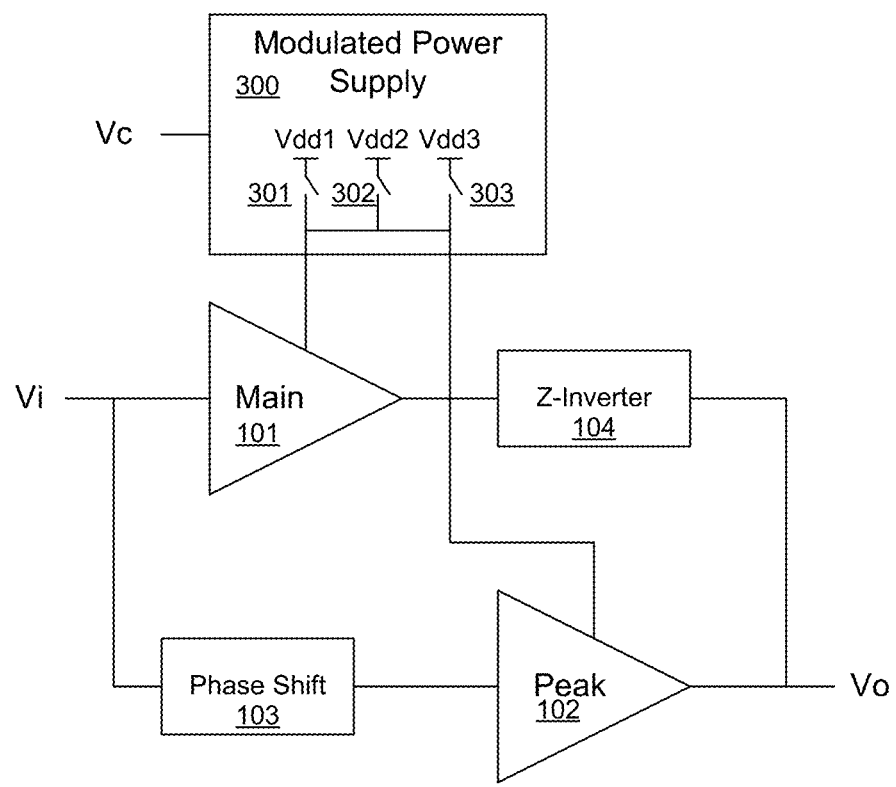
FIG. 3 illustrates an example power amplifier according to one embodiment.

FIG. 3 illustrates an example power amplifier according to one embodiment. FIG. 3 illustrates a power amplifier comprising a main amplifier stage 101, peaking amplifier stage 102, phase shift circuit 103, and impedance inverter circuit 104 as described with regard to FIGS. 1 and 2. A power supply circuit 300 is configured to provide one of a plurality of voltages to the power supply terminals of the main amplifier and peaking amplifier. The power supply voltages provided to the power supply terminals of the main and peaking amplifiers are controlled by a signal labeled Vc, which is generated based on a desired output voltage Vo to be produced by the power amplifier. For example, referring to FIG. 2, if Vo is such that the normalized instantaneous output power of the amplifier is between 0 dB and −6 dB, then Vc configures power supply circuit 300 to couple Vdd1 to the power supply terminals of the main and peaking amplifier (e.g., by closing switch 301 and opening switches 302 and 303). However, if Vo is such that the normalized instantaneous output power of the amplifier is between −6 dB and −12 dB, then Vc configures power supply circuit 300 to couple Vdd2 to the power supply terminals of the main and peaking amplifier (e.g., by closing switch 302 and opening switches 301 and 303) so that a difference between the power supply voltage and the power amplifier output voltage is maintained within a predetermined range of high efficiency operation. Likewise, in this example, if Vo is such that the normalized instantaneous output power of the amplifier is below −12 dB, then Vc configures power supply circuit 300 to couple Vdd3 to the power supply terminals of the main and peaking amplifier (e.g., by closing switch 303 and opening switches 301 and 302) to maintain high efficiency operation.

Figure 4:
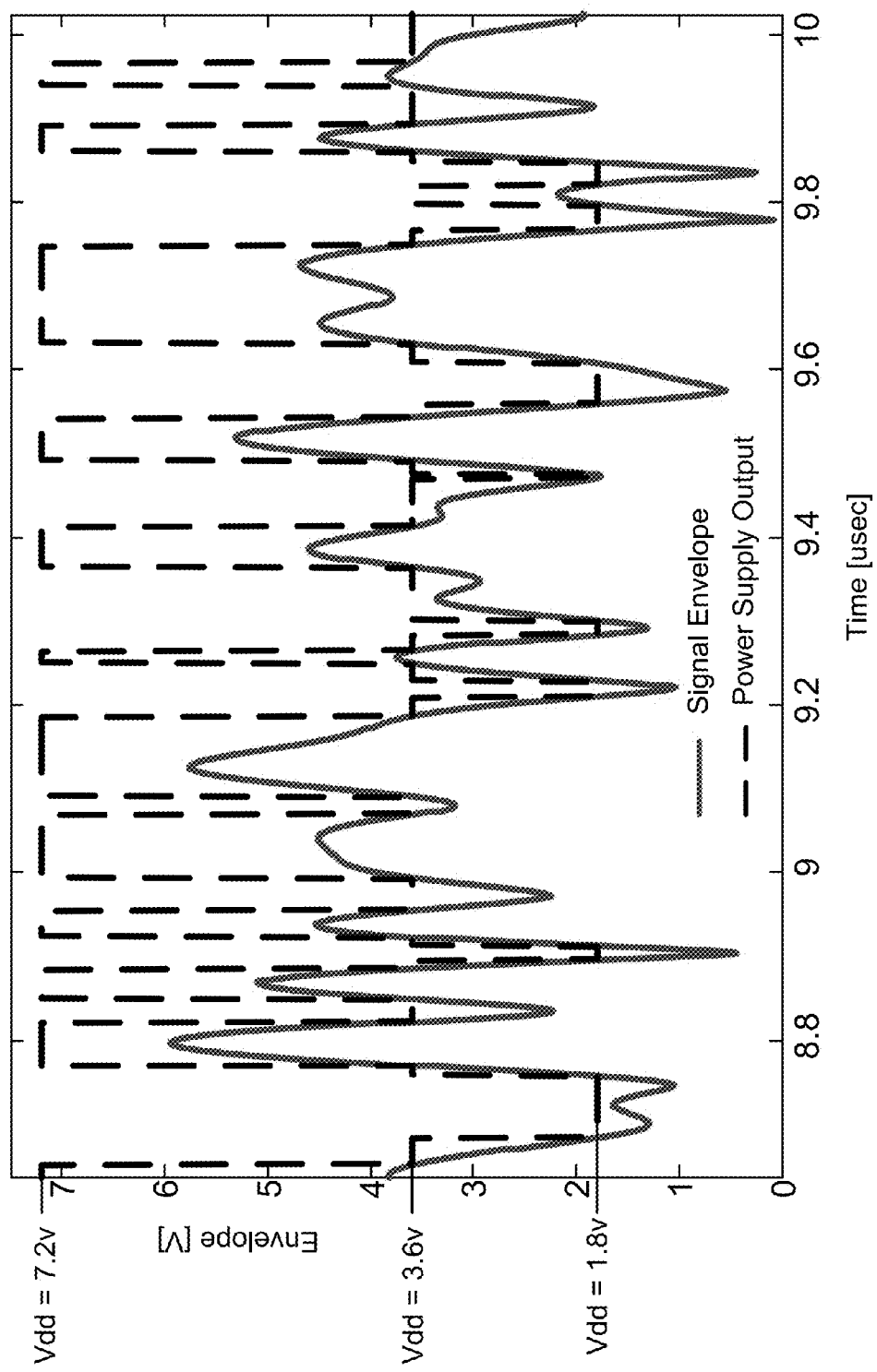
FIG. 4 illustrates an example signal envelop and dynamic power supply voltages according to one embodiment.

FIG. 4 illustrates an example signal envelope and power supply voltages according to one embodiment. In one example implementation, Vdd1 is 7.2 v, Vdd2 is 3.6 v, and Vdd3 is 1.8 v. The signal envelope corresponds to the output voltage, Vo. FIG. 4 shows how the power supply voltage changes based on the signal envelope. Initially, when the signal envelope is above 3.6 v, the supply voltage is set to Vdd1=7.2 volts. This corresponds to a point on the plot in FIG. 2 in range 201 approaching −6 dB. When the signal drops further and crosses a first threshold (e.g., corresponding to −6 dB), the power supply voltage switches to Vdd2=3.6 v, which corresponds to range 202 at a peak of the PAE curve where the output of the power amplifier is operating close to rail-to-rail. Further reduction of the signal envelope in FIG. 4 corresponds to an additional drop in power in FIG. 2. When the signal envelope drops below a next threshold (e.g., corresponding to −12 dB), the power supply voltage switches to Vdd3=1.8 v, which corresponds to range 203 at a peak in the PAE curve where the power amplifier is again operating close to rail-to-rail. FIG. 4 shows how different levels of the signal envelope will cause the power supply to switch the power supply voltage provided to the main and peaking amplifiers so that the system is operating in one of the high efficiency ranges shown in FIG. 2. While three (3) ranges are shown in these examples, additional numbers of ranges could also be used in other implementations.

Figure 5:
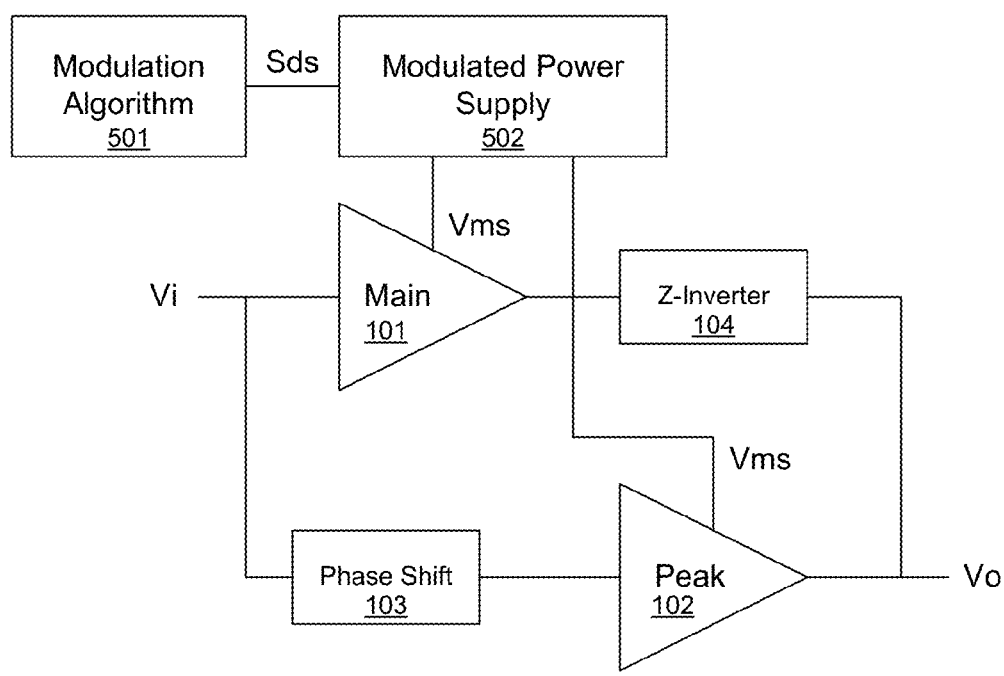
FIG. 5 illustrates an example power amplifier according to another embodiment.

FIG. 5 illustrates an example power amplifier according to another embodiment. The example power amplifier in FIG. 5 comprises a main amplifier 101, peaking amplifier 102, phase shift circuit 103, and impedance inverter circuit 104. In this example, a modulation algorithm block 501 produces a dynamic supply signal Sds coupled to a modulated power supply 502 that produces a dynamic (or modulated) power supply voltage, Vms. Dynamic supply signal Sds is coupled along a dynamic supply path to produce the dynamic power supply voltage Vms from modulated power supply 502. As mentioned above, embodiments of the present disclosure may be used to produce a dynamic power supply voltage Vms for a particular output voltage Vo to maintain high power amplifier efficiency. Since each output voltage has a range of power supply voltages that result in high efficiency (e.g., plateaus), the power supply voltage may be changed at a lower frequency than the signal envelope, thus reducing the bandwidth of the dynamic supply voltage, Vms.

Figure 6:
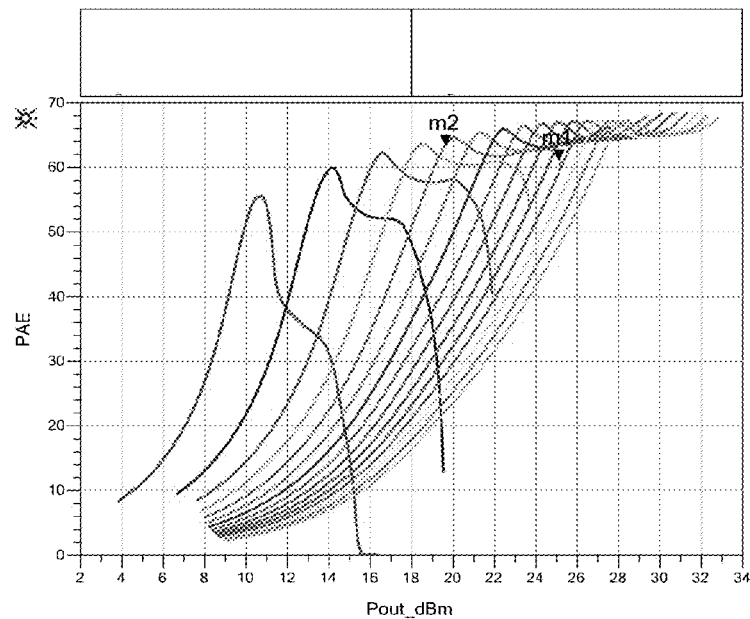
FIG. 6 illustrates power added efficiency at different power supply voltages according to another embodiment.
Figure 7:
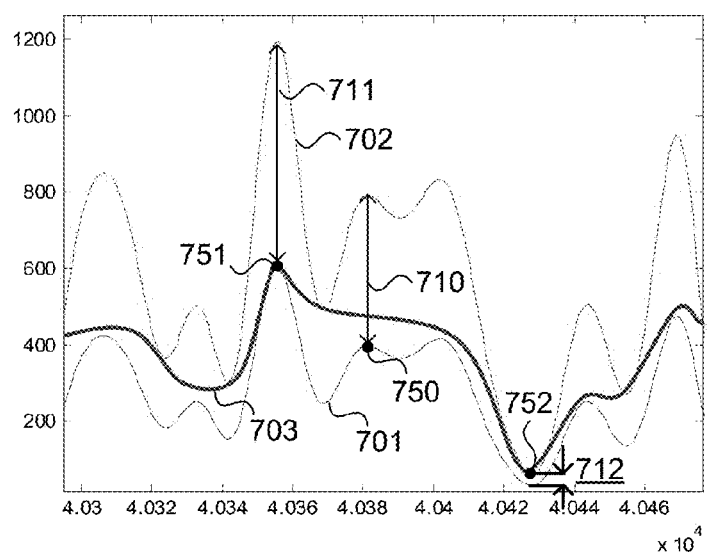
FIG. 7 illustrates an X dB window over time for a signal envelop according to one embodiment.

FIG. 6 illustrates power added efficiency at different power supply voltages according to another embodiment. As shown in FIG. 6, the power supply voltages may vary continuously to shift the plateau of the PAE plot across a wide range of output powers. FIG. 7 illustrates an X dB window over time for a signal envelope according to one embodiment. Waveforms 701 and 702 represent a lower voltage bound (or lower limit) and upper voltage bound (or upper limit), respectively, of a range (or window). For example, waveform 702 may be an upper voltage bound for high efficiency operation (e.g., for an output voltage of a high speed power amplifier) and waveform 701 may be a lower voltage bound for high efficiency operation (e.g., a range comprising an XdB window below the upper voltage bound, where XdB is a peak-to-peak width in decibels, for example, of a high efficiency plateau). In different embodiments, the signal envelope may set the upper or lower voltage bound of the window, which corresponds to conducting the process using different sides of an efficiency plateau as a reference. In this example, for a particular value of the signal envelope, the window represents a range of power supply voltages that may be used to obtain high efficiency operation across a high efficiency plateau. For example, for a point 750 on lower bound 701 there is a corresponding range 710 of supply voltage values that will configure the power amplifier to operate in a high efficiency plateau. Similarly, for a point 751 on lower bound 701 there is a corresponding range 711 of supply voltage values that will configure the power amplifier to operate in a high efficiency plateau. Likewise, for a point 752 on lower bound 701 there is a corresponding range 712 of supply voltage values that will configure the power amplifier to operate in a high efficiency plateau. Waveform 703 shows a dynamic supply signal Sds that may be used to generate a corresponding dynamic supply voltage Vms from modulated power supply 502. Waveform 703 illustrates that the dynamic power supply voltage may traverses a region between the lower bound 701 and upper bound 702, and does not need to track the signal envelope precisely to obtain high efficiency operation. Rather, there are a wide range of paths between the upper limit 702 and lower limit 703 that the dynamic supply voltage may traverse where a difference between the dynamic supply voltage and the power amplifier output voltage is maintained within a high efficiency region of operation. Further, the path may be optimized to achieve different design goals. Referring again to FIG. 5, modulation algorithm 501 may implement an algorithm for generating a dynamic supply signal Sds based on a desired output voltage signal envelope. Dynamic supply signal Sds may be coupled to power supply 502 to produce dynamic supply voltage Vms, for example. A number of different algorithms may be used to produce a dynamic supply signal between an upper bound and a lower bound of the power amplifier's high efficiency range.

Figure 8:
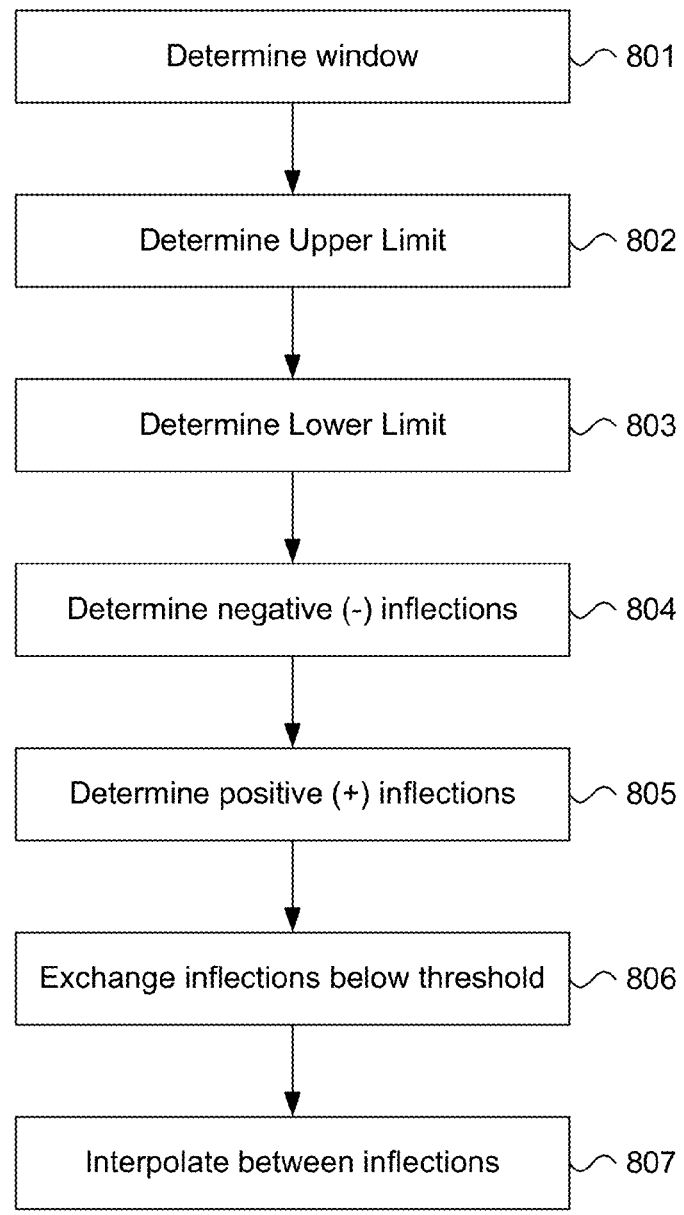
FIG. 8 illustrates an example algorithm for producing a dynamic supply voltage according to one embodiment.

FIG. 8 illustrates an example algorithm for producing a dynamic supply voltage according to one embodiment. As mentioned above with regard to FIG. 1, embodiments of the present disclosure may include preprocessing, such as predistortion, which may produce a dynamic supply signal Sds based on a scaled version of a desired output voltage Vo. A desired output voltage Vo may also be used to generate an input voltage Vi to the power amplifier. The dynamic supply voltage Vms is applied to the power amplifier with the input voltage Vi to produce the desired output voltage Vo.

Referring again to circuitry upstream of the power amplifier output, the scaled version of the desired output voltage Vo may be used to produce a desired supply voltage Vms according to the following example algorithm. At 801, a window may be determined. The window may be a range that corresponds to an efficiency plateau (e.g., an XdB window, where XdB is the width in decibels between Doherty PAE peaks). In some embodiments, it may be desirable to set a minimum value of the dynamic supply voltage (e.g. at Vsupply_min) to guarantee good efficiency and ensure that the power supply voltage on the power amplifier does not go to zero volts. This is sometimes referred to as detroughing. At 802, an upper voltage bound (or upper limit) is determined. In this example, the upper limit may correspond to the scaled signal envelope (e.g., a scaled desired output voltage). At 803, a lower voltage bound (or lower limit) is determined. In this example, the lower limit may correspond to a drop in power of the scaled signal envelope by the window (e.g., XdB). In this example algorithm, negative inflections for the upper limit are determined at 804. Negative inflections correspond to portions of the curve that are local minima (e.g., regions of the curve that change from decreasing to increasing). At 805, positive inflections for the lower limit are determined Positive inflections correspond to portions of the curve that are local maxima (e.g., regions of the curve that change from increasing to decreasing). In some embodiments, it may be desirable to exchange inflections below a threshold (e.g., Vsupply_min mentioned above) with the threshold value at 806. In other words, if an inflection is below Vsupply_min, the process may substitute the inflection value with Vsupply_min. At 807, a dynamic power supply signal may be derived from an interpolation between the inflections. In one example embodiment, an interpolation may connect inflections with a minimum dv/dt interpolation to obtain a dynamic power supply signal, for example.

Figure 9:
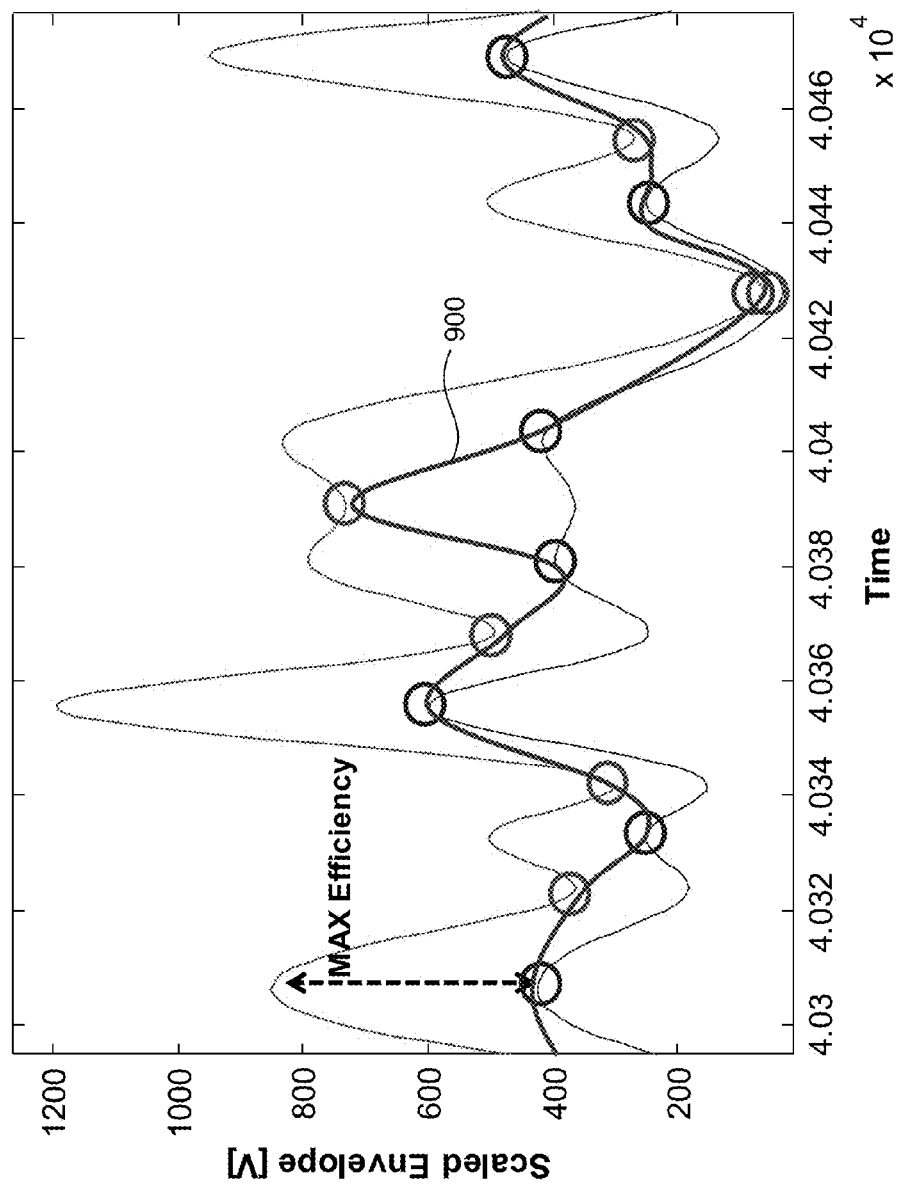
FIG. 9 illustrates upper and lower voltage bounds of a range and a dynamic supply voltage according to one embodiment.

FIG. 9 shows upper and lower limits of a range and a dynamic supply signal according to one embodiment. As illustrated in FIG. 9, a dynamic supply signal is generated based on an interpolated path between positive inflections of the lower voltage bound and negative inflections of the upper voltage bound.

Figure 10:
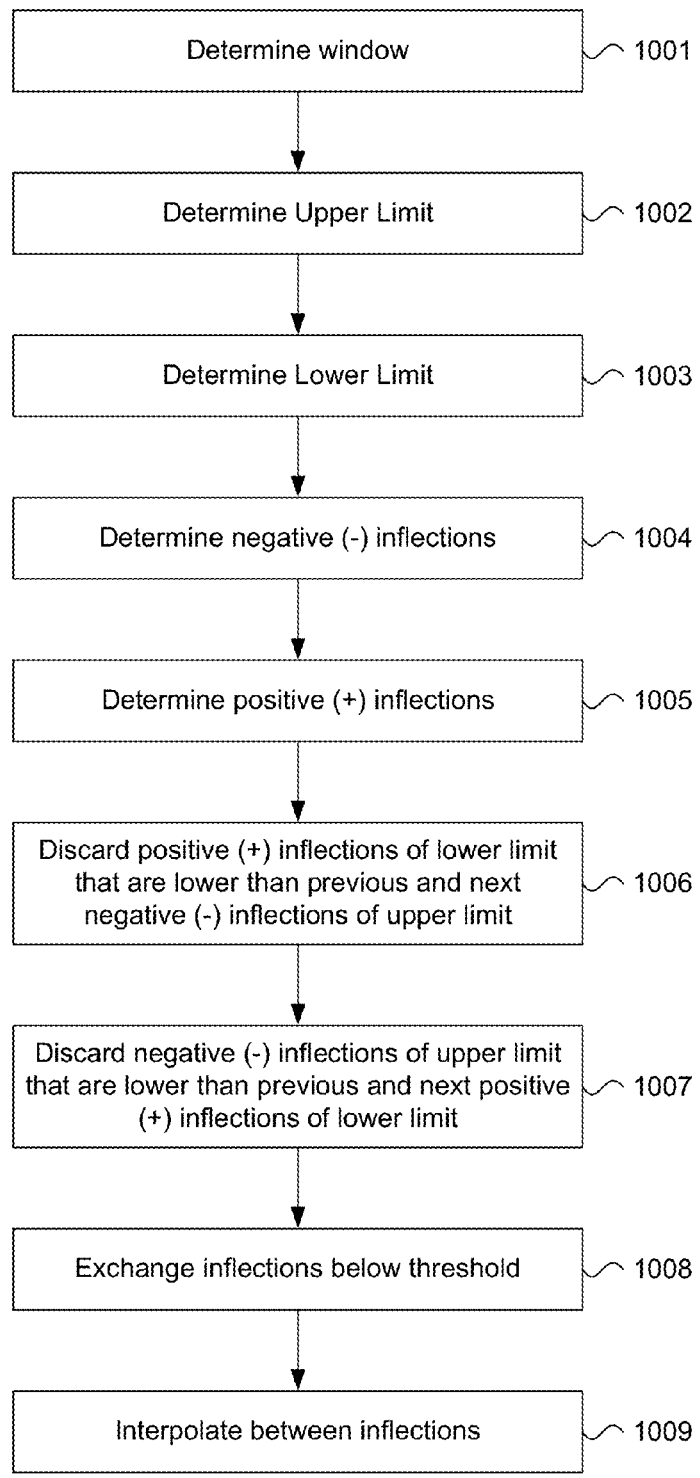
FIG. 10 illustrates another example algorithm for producing a dynamic supply voltage according to another embodiment.
Figure 11:
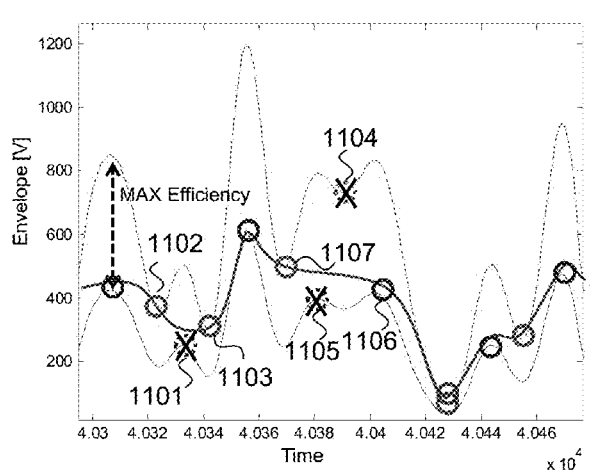
FIG. 11 illustrates producing a dynamic supply signal according to the example in FIG. 10.
Figure 12:
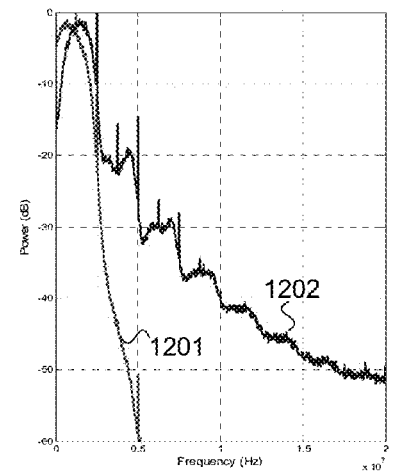
FIG. 12 illustrates the frequency content of an example signal envelope and dynamic supply voltage according to one embodiment.
Figure 13:
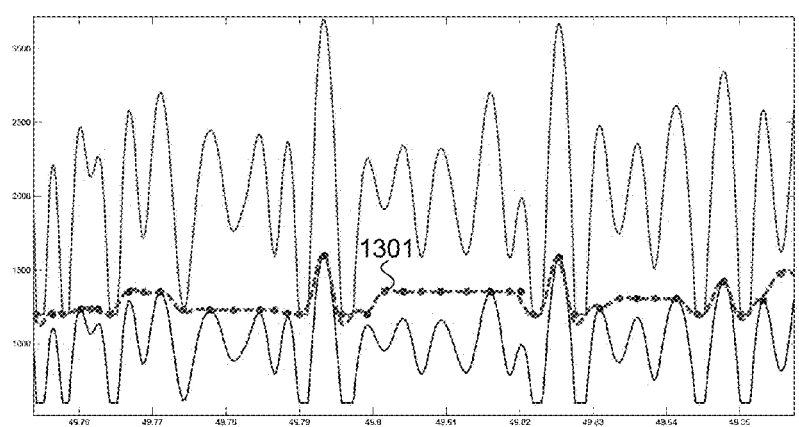
FIG. 13 illustrates upper and lower voltage bounds of a range and a dynamic supply voltage according to another embodiment.

FIG. 10 illustrates another example algorithm for producing a dynamic supply voltage according to another embodiment. In this example, steps 1001-1005 are the same as the algorithm shown in FIG. 8. However, in this example, inflections may be discarded to further reduce the bandwidth of the dynamic supply signal and corresponding dynamic power supply voltage provided to the power amplifier. For example, at 1006 positive inflections of the lower limit may be discarded if a particular positive inflection is lower than a previous negative inflection and a subsequent negative inflection. Referring to FIG. 11, which shows upper and lower limits and a dynamic supply signal, an example of a discarded positive inflection is shown at positive inflection 1101, which is below previous negative inflection 1102 and a subsequent negative inflection 1103. Similarly, referring again to FIG. 10 at 1007, negative inflections of the upper limit may be discarded if a particular negative inflection is higher than a previous positive inflection and a subsequent positive inflection of the lower limit. Referring again to FIG. 11, negative inflection 1104 of the upper limit is discarded because it is above previous positive inflection 1105 and a subsequent positive inflection 1106 of the lower limit. Positive inflection 1105 is also discarded at step 1106 because it is below negative inflections 1104 and 1107. Steps 1008 and 1009 in FIG. 10 may exchange inflections with a minimum threshold (e.g., Vsupply_min) and interpolate between the remaining inflections to produce a dynamic supply signal, for example. FIG. 12 shows the frequency content of an example signal envelope and dynamic supply voltage according to one embodiment. As illustrated, the dynamic supply voltage 1201 has a much lower bandwidth than the signal envelope 1202, which is advantageous because it is typically very difficult to design power supply circuits that can produce dynamic supply voltages to the power supply terminals of a power amplifier with the same bandwidth as the signal envelopes. Accordingly, embodiments of the present disclosure allow a system to use a power supply circuit that has a much lower bandwidth than the power amplifier. FIG. 13 shows the upper and lower limits based on desired output voltages and an XdB window. A dynamic supply signal derived from the positive and negative inflections is shown at 1301.

Figure 14:
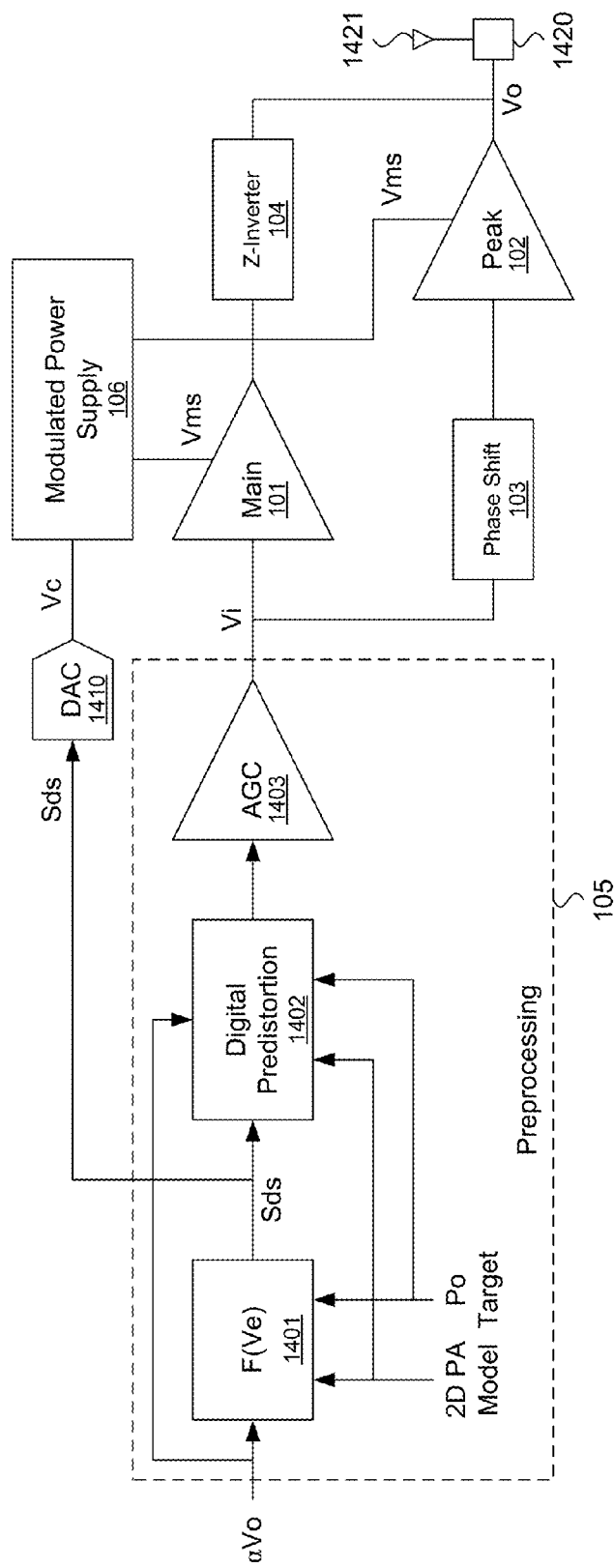
FIG. 14 illustrates an example system diagram according to one embodiment.

FIG. 14 illustrates an example system diagram according to one embodiment. FIG. 14 illustrates an example main amplifier 101, peaking amplifier 102, phase shift circuit 103, impedance inverter circuit 104, preprocessing block 105, and power supply circuit 106 as shown in FIG. 1. In this example, preprocessing block 105 includes a mapping component (e.g., "f(Ve)") 1401 that maps a scaled version of the desired output voltage, αVo, to a dynamic supply signal, Sds, based on signal envelope Ve. Dynamic supply signal Sds is, in turn, used to produce a dynamic supply voltage, Vms, at the power supply terminals of the power amplifier. Mapping component 1401 receives a 2-dimensional power amplifier (2D PA) model and a target output power (Po Target), which are used to generate the dynamic supply signal, Sds, that will produce a dynamic supply voltage, Vms, at the power supply terminals of the main and peaking amplifiers to result in high efficiency operation as described above. The 2D PA model for an RF amplifier may comprise multiple performance surfaces over the input voltage and supply voltage, for example. Performance attributes over these inputs may include the magnitude of the voltage gain, AMPM or phase of the voltage gain, and the supply current, for example. The mapping component includes a mapping function f(Ve) to produce a dynamic supply signal Sds to a power supply circuit, and may implement an algorithm to generate an interpolated dynamic supply signal, such as one of the algorithms described above. The output of the mapping component 1401 produces a dynamic supply signal, Sds, which is provided as an input to a DAC 1410 to produce an control voltage, Vc, to control the power supply circuit 106.

The dynamic supply signal Sds and scaled version of the desired output voltage αVo are received on the inputs of a digital predistortion block ("DPD") 1402. DPD 1402 also receives the 2D PA model and target output power to produce a signal to automatic gain control ("AGC") 1403, which generates input voltage, Vi. Input voltage Vi and dynamic supply voltage Vms are provided to the power amplifier to produce output voltage Vo, which is coupled through a combiner circuit 1420 to drive antenna 1421, for example.

Figure 15:
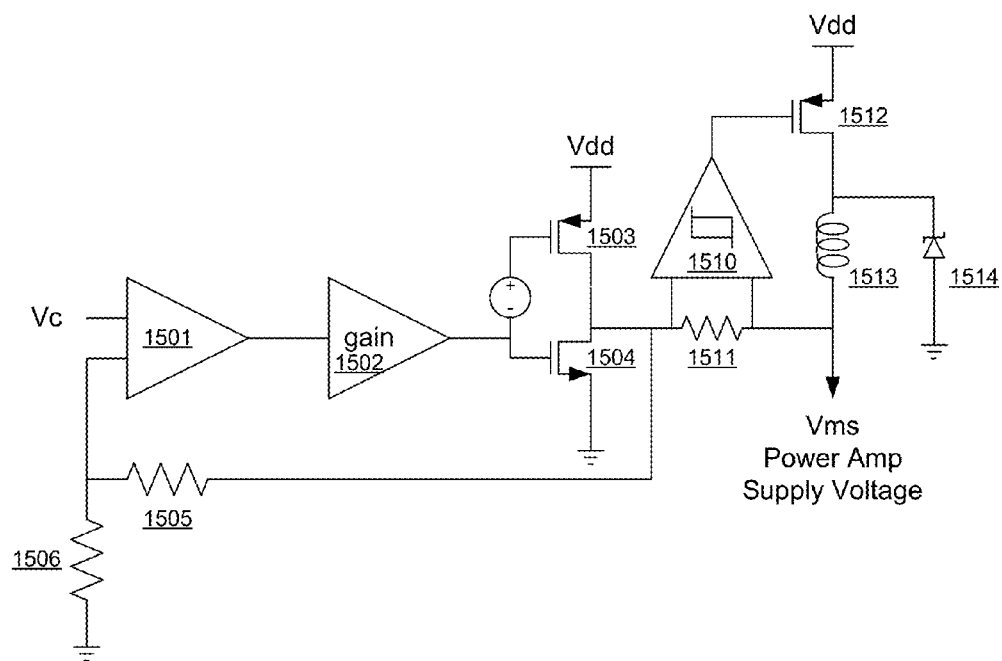
FIG. 15 is an example power supply circuit.

FIG. 15 is an example power supply circuit that may be used to generate a dynamic supply voltage. A control voltage Vc is amplified by a linear amplifier stage 1501 and gain stage 1502 to drive MOS transistors 1503 and 1504. Voltage feedback is provided by feedback resistors 1505 and 1506. A switching stage includes hysteretic amplifier 1510, sense resistor 1511, PMOS pass transistor 1512, inductor 1513, and diode 1514. Supply voltage Vdd is coupled through PMOS transistor 1512 and inductor 1513 to produce dynamic supply voltage Vms.

Figure 16:
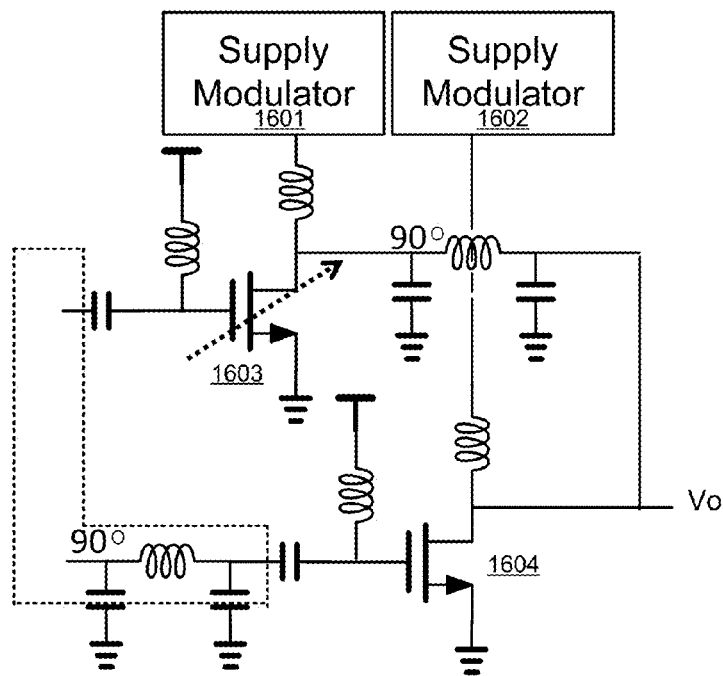
FIG. 16 illustrates a power amplifier according to another embodiment.
Figure 17:
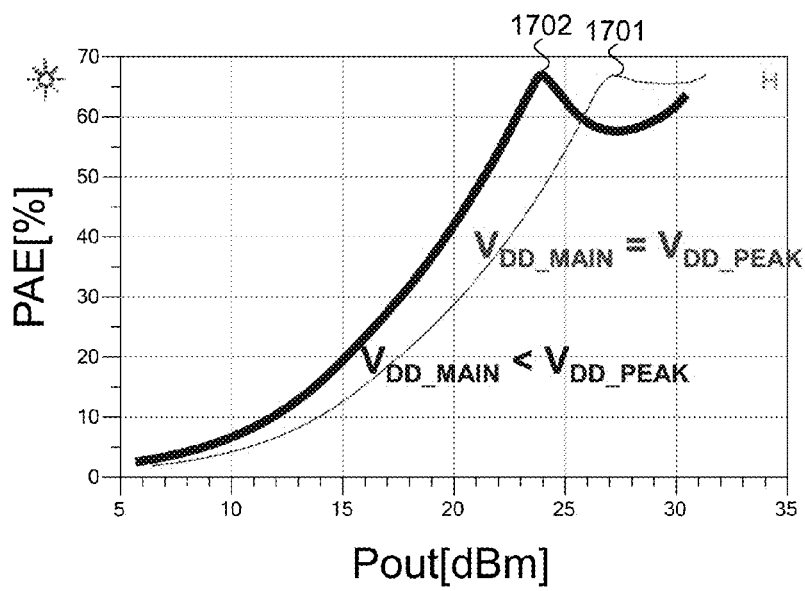
FIG. 17 illustrates varying the efficiency plateau according to another embodiment.

FIG. 16 illustrates a power amplifier according to another embodiment. In this example the main amplifier stage and peaking amplifier stage received different power supply voltages. For example, a main amplifier stage comprises NMOS transistor 1603, which is coupled to power supply 1601. A peaking amplifier stage comprises NMOS transistor 1604, and is coupled to power supply 1602. Applying different voltages to the supply terminals of the main and peaking amplifiers changes the width and peaks of an efficiency plateau. FIG. 17 illustrates varying the efficiency plateau according to one embodiment. Curve 1701 shows a plateau when the main and peaking amplifiers have the same power supply voltage. However, a distance in dB between peaks and the shape of the plateau may be modified by driving each amplifier with different power supply voltages. In this example, a larger distance in dB between peaks may be achieved when the supply voltage for the peaking amplifier is greater than the supply voltage for the main amplifier as illustrated by curve 1702. Accordingly, in one embodiment, the dynamic supply voltage for one of the main or peaking amplifiers may be different than the dynamic supply voltage for the other amplifier (e.g., separated by an offset). In some applications it may be desirable to extend the high efficiency window of an RF power amplifier relative to the bandwidth of the power supply circuit, for example. Different supply voltages may advantageously allow for lower bandwidth in the power supply circuit relative to the bandwidth of power amplifier, or conversely, higher bandwidth of the power amplifier with a lower bandwidth for the modulated power supply, with a modest reduction of efficiency between the peaks, for example.

Referring again to FIG. 16, another technique for adjusting the characteristics of the power amplifier efficiency curve is to change the size of the transistors in the main and peaking power amplifiers. For example, curve 1701 in FIG. 17 and the efficiency curves in FIG. 2 are for equal size transistors. In one embodiment, the size of the main amplifier transistor 1603 may be configured to be different than the size of the peaking amplifier transistor 1604 to change the efficiency curve. In one embodiment, the main amplifier transistor 1603 may be dynamically modified to change the efficiency curve so that different dynamic supply voltages may be used to drive the system at different output voltage levels. Different size transistors for the main and peaking amplifiers may similarly allow for lower bandwidth in the power supply circuit relative to the bandwidth of power amplifier.

Figure 18:
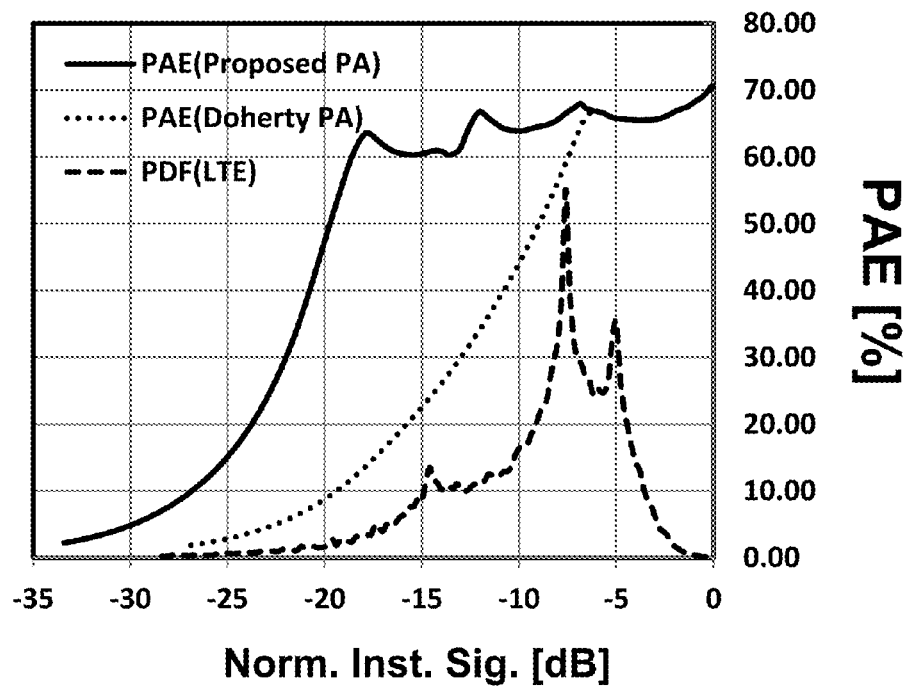
FIG. 18 compares efficiency of a standard Doherty power amplifier with an example embodiment.
Figure 19:
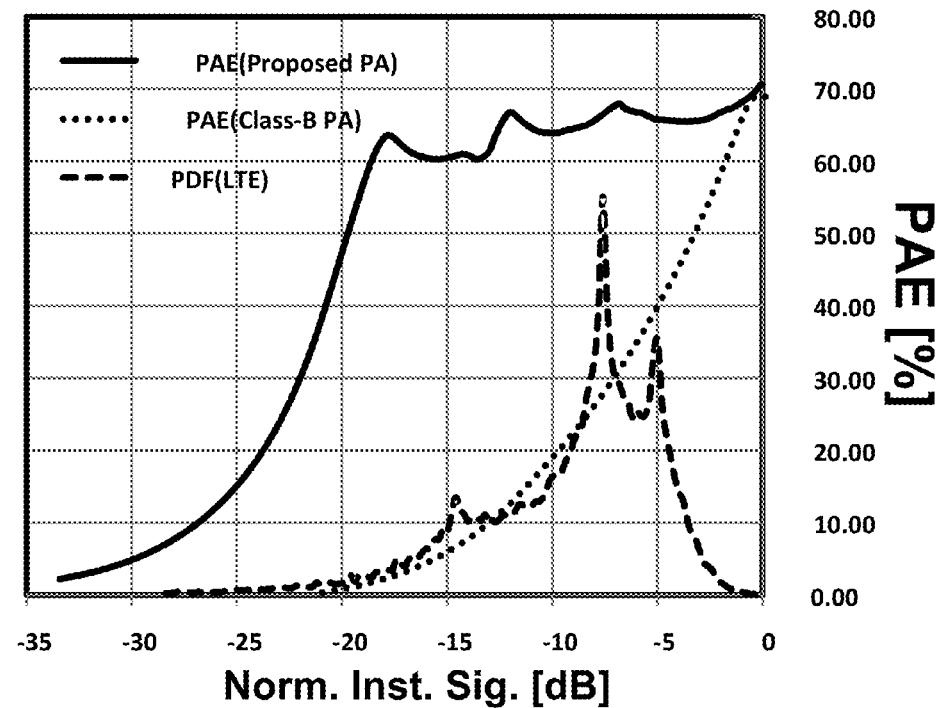
FIG. 19 compares efficiency of a class B power amplifier with an example embodiment.

FIG. 18 compares efficiency of a standard Doherty power amplifier with an example embodiment. This plot shows a probability distribution function of an LTE signal, which shows how often the signal is at a particular instantaneous power level given an average transmit power. FIG. 18 illustrates that a wide range of high efficiency operation that may be obtained by modifying the power supply voltage for the power amplifiers described above. The plot compares one example of the proposed power amplifier technique against traditional Doherty power amplifier operation. The proposed technique delivers high efficiency across a wider range of signal powers than a traditional Doherty. FIG. 19 shows a similar diagram for LTE, comparing the efficiency of a class B power amplifier against one example of the proposed power amplifier technique.

Envelope tracking typically has a one-to-one relationship between the magnitude of the instantaneous input voltage of the power amplifier and the supply voltage. Advantages of example embodiments described above may allow for a one-to many-relationship between a signal envelope and a power supply voltage used to power a main and peaking amplifier, for example, thereby allowing some embodiments to use modulated power supplies with lower bandwidths than the RF PA.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
a power amplifier comprising a main amplifier stage and a peaking amplifier stage, wherein an output of the peaking amplifier stage is coupled to an output of the main amplifier stage through an impedance inverter circuit, wherein the output of the peaking amplifier stage is coupled to an output terminal of the power amplifier, the power amplifier producing an output voltage on the output terminal, wherein the main amplifier stage comprises a first power supply terminal and the peaking amplifier stage comprises a second power supply terminal;
a power supply circuit coupled to the first power supply terminal and the second power supply terminal to provide one or more dynamic supply voltages to the main amplifier stage and to the peaking amplifier stage,
wherein the power supply circuit adjusts the one or more dynamic supply voltages so that a difference between at least one of the one or more dynamic supply voltages and the power amplifier output voltage is maintained within a predetermined range, and wherein at least one of the dynamic supply voltages varies continuously corresponding to the output voltage; and
a mapping component to receive a scaled version of a desired output voltage and produce a dynamic supply signal between an upper voltage bound and a lower voltage bound, wherein the lower voltage bound is separated from the upper voltage bound by a window corresponding to said range.

2. The circuit of claim 1 wherein a bandwidth of the power amplifier is greater than a bandwidth of the power supply circuit.

3. The circuit of claim 1 wherein the mapping component generates the dynamic supply signal by interpolating between a plurality of inflections of the upper voltage bound and the lower voltage bound.

4. The circuit of claim 3 wherein a negative inflection of the upper voltage bound is discarded from the interpolation if a previous positive inflection of the lower voltage bound and a subsequent positive inflection of the lower voltage bound are below the negative inflection.

5. The circuit of claim 3 wherein a positive inflection of the lower voltage bound is discarded from the interpolation if a previous negative inflection of the upper voltage bound and a subsequent negative inflection of the upper voltage bound are above the positive inflection.

6. The circuit of claim 1 wherein the main amplifier stage and the peaking amplifier stage receive the same dynamic supply voltage.

7. The circuit of claim 1 wherein the main amplifier stage and the peaking amplifier stage receive different dynamic supply voltages.

8. The circuit of claim 1 wherein a transistor in the main amplifier stage is configured to a plurality of different sizes.

9. The circuit of claim 1 wherein the power amplifier is a Doherty power amplifier.

10. A method comprising:
generating an output voltage in a power amplifier, the power amplifier comprising a main amplifier stage and a peaking amplifier stage, wherein an output of the peaking amplifier stage is coupled to an output of the main amplifier stage through an impedance inverter circuit, wherein the output of the peaking amplifier stage is coupled to an output terminal of the power amplifier, wherein the main amplifier stage comprises a first power supply terminal and the peaking amplifier stage comprises a second power supply terminal;
generating one or more dynamic supply voltages in a power supply circuit, wherein the one or more dynamic supply voltages are coupled to the first power supply terminal of the main amplifier stage and the second power supply terminal of the peaking amplifier stage,
wherein the power supply circuit adjusts the one or more dynamic supply voltages so that a difference between at least one of the one or more dynamic supply voltages and the power amplifier output voltage is maintained within a predetermined range,
wherein the one or more dynamic supply voltages is one dynamic supply voltage coupled to the first and second power supply terminals, and wherein the power supply circuit generates said dynamic supply voltage having one of a plurality of discrete voltage levels when a level of the output voltage is in one of a corresponding plurality of ranges, and
wherein the plurality of ranges correspond to approximately equal width, in decibels, between power added efficiency (PAE) peaks of the power amplifier for each of the plurality of discrete levels of the dynamic supply voltage.

11. A method comprising:
generating an output voltage in a power amplifier, the power amplifier comprising a main amplifier stage and a peaking amplifier stage, wherein an output of the peaking amplifier stage is coupled to an output of the main amplifier stage through an impedance inverter circuit, wherein the output of the peaking amplifier stage is coupled to an output terminal of the power amplifier, wherein the main amplifier stage comprises a first power supply terminal and the peaking amplifier stage comprises a second power supply terminal; and generating one or more dynamic supply voltages in a power supply circuit, wherein the one or more dynamic supply voltages are coupled to the first power supply terminal of the main amplifier stage and the second power supply terminal of the peaking amplifier stage, wherein the power supply circuit adjusts the one or more dynamic supply voltages so that a difference between at least one of the one or more dynamic supply voltages and the power amplifier output voltage is maintained within a predetermined range, wherein the one or more dynamic supply voltages is one dynamic supply voltage coupled to the first and second power supply terminals, and wherein the power supply circuit generates said dynamic supply voltage having one of a plurality of discrete voltage levels when a level of the output voltage is in one of a corresponding plurality of ranges, and wherein the power supply circuit generates the one dynamic supply voltage having a first voltage level when the level of the output voltage is less than a maximum output voltage level and greater than a first output voltage level, wherein the power supply circuit generates the one dynamic supply voltage having a second voltage level less than the first voltage level when the level of the output voltage is less than the first output voltage level and greater than a second output voltage level, and wherein the power supply circuit generates the one dynamic supply voltage having a third voltage level less than the second voltage level when the level of the output voltage is less than the second output voltage level and greater than a third output voltage level.

12. A method comprising:

generating an output voltage in a power amplifier, the power amplifier comprising a main amplifier stage and a peaking amplifier stage, wherein an output of the peaking amplifier stage is coupled to an output of the main amplifier stage through an impedance inverter circuit, wherein the output of the peaking amplifier stage is coupled to an output terminal of the power amplifier, wherein the main amplifier stage comprises a first power supply terminal and the peaking amplifier stage comprises a second power supply terminal;

generating one or more dynamic supply voltages in a power supply circuit, wherein the one or more dynamic supply voltages are coupled to the first power supply terminal of the main amplifier stage and the second power supply terminal of the peaking amplifier stage, wherein the power supply circuit adjusts the one or more dynamic supply voltages so that a difference between at least one of the one or more dynamic supply voltages and the power amplifier output voltage is maintained within a predetermined range, and wherein the dynamic supply voltages vary continuously corresponding to the output voltage; and mapping a scaled version of a desired output voltage to a dynamic supply signal between an upper voltage bound and a lower voltage bound, wherein the lower voltage bound is separated from the upper voltage bound by a window corresponding to said range.

13. The method of claim 12 wherein the mapping generates the dynamic supply signal by interpolating between a plurality of inflections of the upper voltage bound and the lower voltage bound.

14. The method of claim 13 wherein a negative inflection of the upper voltage bound is discarded from the interpolation if a previous positive inflection of the lower voltage bound and a subsequent positive inflection of the lower voltage bound are below the negative inflection.

15. The method of claim 13 wherein a positive inflection of the lower voltage bound is discarded from the interpolation if a previous negative inflection of the upper voltage bound and a subsequent negative inflection of the upper voltage bound are above the positive inflection.

16. The method of claim 10 wherein the main amplifier stage and the peaking amplifier stage receive the same dynamic supply voltage.

17. The method of claim 10 wherein a transistor in the main amplifier stage is configured to a plurality of different sizes.

18. The method of claim 10 wherein the power amplifier is a Doherty power amplifier.

19. The method of claim 11 wherein the main amplifier stage and the peaking amplifier stage receive the same dynamic supply voltage.

20. The method of claim 11 wherein a transistor in the main amplifier stage is configured to a plurality of different sizes.

21. The method of claim 12 wherein a bandwidth of the power amplifier is greater than a bandwidth of the power supply circuit.

22. The method of claim 12 wherein the main amplifier stage and the peaking amplifier stage receive the same dynamic supply voltage.

23. The method of claim 12 wherein the main amplifier stage and the peaking amplifier stage receive different dynamic supply voltages.

24. The method of claim 12 wherein a transistor in the main amplifier stage is configured to a plurality of different sizes.

* * * * *